(12) United States Patent
Wissell et al.

(10) Patent No.: US 6,184,736 B1
(45) Date of Patent: *Feb. 6, 2001

(54) SINUSOIDAL RADIO-FREQUENCY CLOCK DISTRIBUTION SYSTEM FOR SYNCHRONIZATION OF A COMPUTER SYSTEM

(75) Inventors: Daniel Wissell, Acton, MA (US); Paul A. Galloway, Derry, NH (US)

(73) Assignee: Compaq Computer Corporation, Houston, TX (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/315,588

(22) Filed: May 20, 1999

Related U.S. Application Data

(63) Continuation of application No. 08/892,459, filed on Jul. 14, 1997, which is a continuation of application No. 08/133,810, filed on Oct. 8, 1993, which is a continuation of application No. 07/862,796, filed on Apr. 3, 1992.

(51) Int. Cl.[7] .............................. H03K 12/00; H03K 5/00; G06F 1/04
(52) U.S. Cl. .................. 327/295; 327/184; 327/291; 327/565; 333/109; 333/238; 333/1
(58) Field of Search .................. 327/291, 292, 327/293, 295, 296, 596, 564, 565, 184, 311, 558, 552, 344; 333/238, 109, 1

(56) References Cited

U.S. PATENT DOCUMENTS

| | | |
|---|---|---|
| 2,691,551 | 8/1954 | Mattson .................................. 406/41 |
| 3,164,818 | 1/1965 | Kingsford-Smith .................... 360/51 |
| 3,197,984 | 8/1965 | Cilyo ....................................... 327/311 |
| 3,582,909 | 6/1971 | Booher .................................. 307/279 |
| 3,789,380 | 1/1974 | Cannon .............................. 340/174.1 |
| 4,357,609 | 11/1982 | Spencer ............................... 343/12 R |
| 4,516,077 | 5/1985 | Fenneman et al. .................... 324/425 |
| 4,605,915 | 8/1986 | Marshall et al. ...................... 333/238 |
| 4,673,898 | 6/1987 | Redmond ............................. 333/109 |
| 4,808,936 | 2/1989 | Lamb ................................... 328/155 |
| 4,926,066 | 5/1990 | Maini et al. ........................ 307/303.1 |
| 5,150,088 | 9/1992 | Virga et al. ........................... 333/238 |
| 5,157,277 | 10/1992 | Tran et al. ............................ 327/156 |
| 5,258,660 | 11/1993 | Nelson et al. ........................ 327/141 |
| 5,278,524 | 1/1994 | Mullen ...................................... 333/1 |
| 5,281,861 | 1/1994 | Tran et al. ............................ 327/141 |
| 5,313,174 | 5/1994 | Edwards ............................... 333/109 |
| 5,394,443 | * 2/1995 | Byers et al. .......................... 327/295 |
| 5,442,475 | * 8/1995 | Bausman et al. .................... 327/295 |

OTHER PUBLICATIONS

O. A. Horne, "Sinusoidal Clock Overcomes Network Performance Bugs", *Electronics*, p. 96–99, Jan. 23, 1975.

\* cited by examiner

*Primary Examiner*—Dinh T. Le
(74) *Attorney, Agent, or Firm*—Hamilton, Brook, Smith & Reynolds, P.C.

(57) ABSTRACT

A clock generation system generates and distributes sinusoidal signals. Also, the clock lines are configured and shielded in a novel manner so as to provide the same overall propagation characteristics for the clock signals in all the lines, and to minimize the effects of cross-talk and electromagnetic interference.

10 Claims, 3 Drawing Sheets

SINUSOIDAL RADIO-FREQUENCY CLOCK DISTRIBUTION SYSTEM FOR SYNCHRONIZATION OF A COMPUTER SYSTEM

RELATED APPLICATIONS

This application is a Continuation of application Ser. No. 08/892,459, filed on Jul. 14, 1997, which is a File Wrapper Continuation of application Ser. No. 08/133,810, filed on Oct. 8, 1993, which is a File Wrapper Continuation of Ser. No. 07/862,796, which was filed on Apr. 3, 1992, the entire teachings of which are incorporated herein by reference.

FIELD OF THE INVENTION

This invention relates generally to a digital computer, and more particularly to the distribution of clock signals for timing and synchronizing devices of the computer that are interconnected by a common, high-speed, synchronous, bidirectional bus.

BACKGROUND OF THE INVENTION

A conventional digital computer includes various components or "modules," such as a central processing unit ("CPU"), main memories, and an input/output ("I/O") unit, which are all interconnected for transferring signals therebetween by a common bus. For synchronous operation, the computer modules receive clock signals to control the timing of their operations. The clock signals synchronize, for example, the transfer and reception of data and other signals between the computer modules.

The computer typically employs digital clock signals, i.e., trains of rectangular pulses. The digital clock signals are characterized by a pulse rate or periodicity at the desired clock frequency of, e.g., about 58 mega-Hertz ("MHz"). Typically, at such radio-frequencies, the pulses have rapid rise times in the nanosecond range.

For proper operation of the computer, the clock signal received by each module should have the same phase as that of each of the other clock signals received by the other modules, and should not have significant levels of distortion (e.g., wave shape distortion). A phase difference in the received clock signals is called "clock skew." Where clock skew is present, modules on the bus can require corresponding additional time to latch onto data and other signals sent over the bus, thus decreasing the maximum bus speed. Extreme levels of clock skew can have even more pernicious effects on computer performance; for example, system components may be unable to receive and decode data and other signals sent over the bus.

To ensure that the clock signals have as nearly identical phases as possible at the respective modules, the computer typically generates the clock signals centrally and distributes them over clock lines of the bus to receiver circuits of the computer modules. In each clock receiver circuit, the incoming clock signal is amplified, any distortion in the rectangular shape of the pulses is removed, and the clock signals are replicated into multiple copies for use by various circuits within the module.

Generally speaking, known high-performance clock generating systems that distribute multiple clock signals to computer modules for precise synchronization of their operation use time-delay adjustments to compensate for clock skew at the receiver ends of the system. The use of such time-delay adjustments can be costly in terms of design, implementation, and overhead. Moreover, clock skew can be difficult to predict, and therefore it is difficult to provide the proper amount of time-delay adjustment at the receiver end.

Accordingly, it would be desirable to provide a technique for preventing the introduction of clock skew in the first place, i.e., during the generation and distribution of the clock signals.

SUMMARY OF THE INVENTION

The invention resides in a clock generation system of a digital computer, which generates radio-frequency sinusoidal signals that are distributed over dedicated clock lines to clock-users, i.e., the components or modules within the computer. Also, the clock lines are configured and shielded in a novel manner so as to provide the same overall propagation rates for the clock signals in all the lines, and to minimize the effects of cross-talk and electromagnetic interference, thus reducing both clock skew and distortion. The clock signals provided by the invention do not require time-delay adjustments at the clock receivers in most applications to compensate for clock skew originating in the clock generation system.

The invention permits the generation of clock signals at, e.g., about 58 MHz, having minimal clock skews, e.g., on the order of 50 to 100 picoseconds, which is an order of magnitude lower than the two to three nanosecond skews of clock signals in known prior art clock distribution systems.

More specifically, the clock generation system of the invention includes a clock generation module, a distribution system, and receiver circuits in clock-user modules, which are preferably implemented on a single printed circuit board (the "mother board") of the computer.

The clock generation module includes an oscillator for generating a sinusoidal signal at a pre-selected clock frequency, which typically contains harmonics thereof; a low-pass filter for filtering the sinusoidal signal to substantially attenuate the harmonics; and a signal splitting circuit for generating copies of the filtered sinusoidal signals, the copies also being sinusoidal in nature. In a preferred implementation, the signal splitting circuit includes both a phase splitter for generating quadrature-related clock signals, and signal splitters for providing multiple copies of those clock signals. Other applications that do not require quadrature-related clock signals can eliminate the phase splitter.

The distribution system includes the shielded clock lines of a synchronous bus, which distribute the sinusoidal clock signals to the clock-user modules. The clock lines have the same overall dimensions, including lengths (i.e., distances between the clock generation module and each clock-user module), material, and signal propagation characteristics.

Each clock-user-module receiver circuit is preferably implemented on a single integrated-circuit chip, and serves to convert at least one of the sinusoidal clock signals into a digital clock signal for use by the module. Where quadrature-related sinusoidal clock signals are distributed to the modules, the receiver circuit converts both those sinusoidal signals into quadrature-related digital clock signals.

In accordance with another aspect of the invention, each clock line is shielded against cross-talk and radio-frequency, electromagnetic radiation by a strip-line arrangement that surrounds each clock line. The strip-line arrangement includes conductive planes and conductive vias (i.e., plated through-holes) provided in the mother board and the modules. Specifically, each clock line is disposed between and isolated from top and bottom conductive planes, and flanked by and isolated from spac conductive vias that interconnect the conductive planes The spacing between the conductive vias is approximatel ¹⁄10 of the smallest wavelength of the radiation agains which the clock lines is shielded. For instance, this distance is about 0.2 to 0.3 inches (0.5 to 0.76 cm) fc isolating against signals having frequencies less than about two gigahertz.

This arrangement effectively blocks both cross-talk between clock lines and electromagnetic interference from other sources. In addition, this arrangement blocks the emmission of electromagnetic radiation from the clock lines, which is frequently desirable to prevent signal interference in other computer components and to comply with applicable governmental standards.

This invention is based on the recognition that.prior art clock distribution arrangements often introduced unacceptable levels of clock skew and distortion because of signal propagation rate variations between the clock lines of the synchronous buses used to distribute the clock signals. Propagation rates in these lines are frequency dependent.

Even though only a single clock frequency may be desired, the clock lines of prior art systems carry signals at various other frequencies. Specifically, these are mainly the multiple harmonics of the clock frequency, which can be found in the digital clock signals. The range and magnitude of the harmonics in the prior art clock signals are due to the rapid rise and fall times of the pulses in these signals. Other unwanted components in the clock signals may be produced by cross-talk from other bus lines, and electromagnetic interference from other sources.

Moreover, electrical devices in prior art clock generation systems can introduce clock skews into the clock signals as a consequence of the dependence of signal propagation delays within those devices on variations in chip fabrication processes, operating factors such as the applied voltages and load conditions, and environmental conditions such as ambient temperature during use.

In "Electronics" magazine, Jan. 23, 1975, the problem of clock skew was addressed with respect to high-speed computer networks by distributing "sinusoidal" clock signals, rather than "digital" clock signals, so as to facilitate compensation for clock skew. The sinusoidal clock signals are amplified in the clock receivers, phase shifted to add the necessary delays to compensate for clock skew, and finally clipped to provide the rectangular shape necessary to drive the "clock inputs" of clock-using subsystems. Distributing sinusoidal clock signals was said in that magazine to facilitate the clock skew adjustment by permitting the use of RC networks as phase-shifting circuits. Accordingly, even though the network in that article distributed sinusoidal signals, compensating time-delay adjustments were believed necessary.

Moreover, it has not been recognized heretofore that the relatively short run lengths of clock lines used in computers (compared to the lengthy cables used to interconnect networks) could produce clock skews and distortion that can be avoided, at least in part, by distributing sinusoidal signals.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
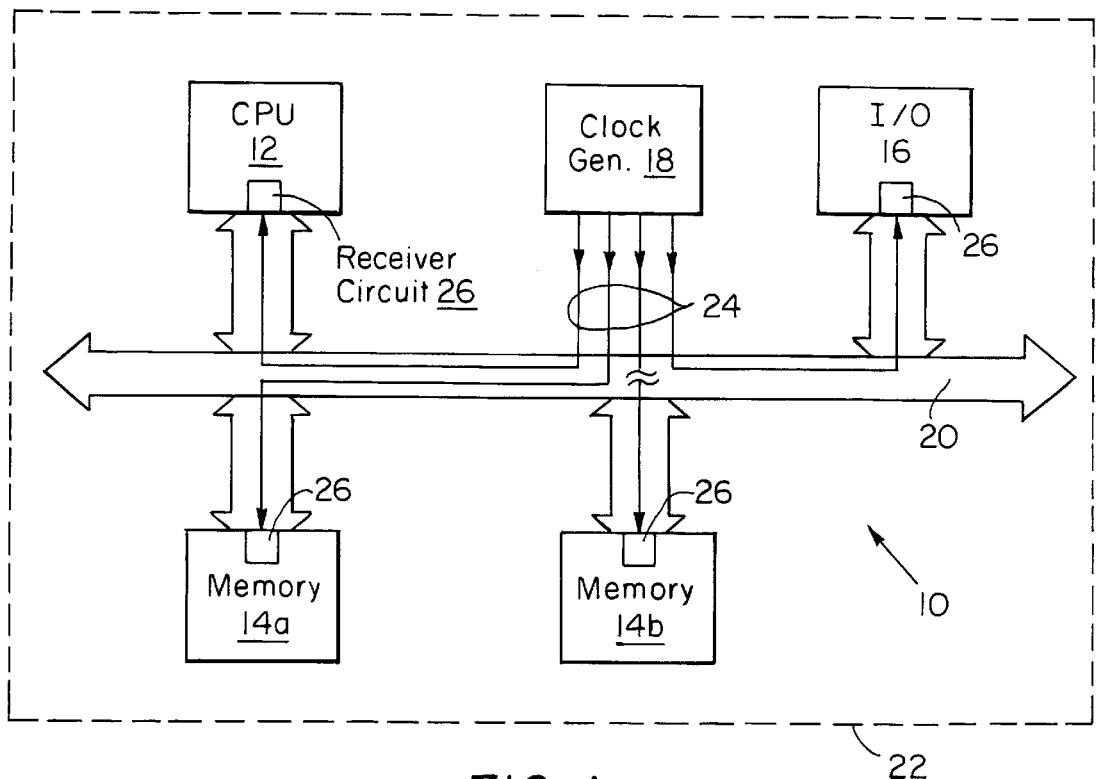
FIG. 1 is a block diagram of a synchronous computer system in accordance with the invention.

FIG. 1 shows a synchronous computer system 10, including a central processing unit ("CPU") module 12, first and second main memory modules 14a, 14b, an input/output unit module 16, and a clock generation module 18, all interconnected by a high-speed, bi-directional, synchronous bus 20. The clock module 18 generates identical system clock signals for synchronizing the operations of the computer system 10. The clock signals are at radio frequencies typically below about one gigahertz, e.g., at about 58 megaHertz ("MHz"). Preferably, the modules 12, 14a, 14b, 16 are mounted on a single printed circuit ("pc") board 22, called a "mother board."

Each system clock signal is distributed by a separate, unidirectional clock line 24 of the synchronous bus 20 to one of the modules 12, 14a, 14b, 16 of the computer system 10. Preferably, the clock lines 24 are implemented as conductive paths provided by metalizations on the pc board 22 and are of substantially the same overall dimensions, including length, material, and overall signal propagation characteristics, as further described below.

A clock receiver circuit 26 (also called a "repeater circuit") located on each module 12, 14a, 14b, 16 receives the distributed system clock signals as an input signal. Preferably, the receiver circuit 26 includes a VLSI CMOS, integrated circuit chip functionally configured to shape and amplify the input signal prior to generating multiple copies of it. The resulting processed output clock signals are thereafter distributed to components of the modules 12, 14a, 14b, 16 whose operations are to be synchronized by means thereof.

Figure 2:
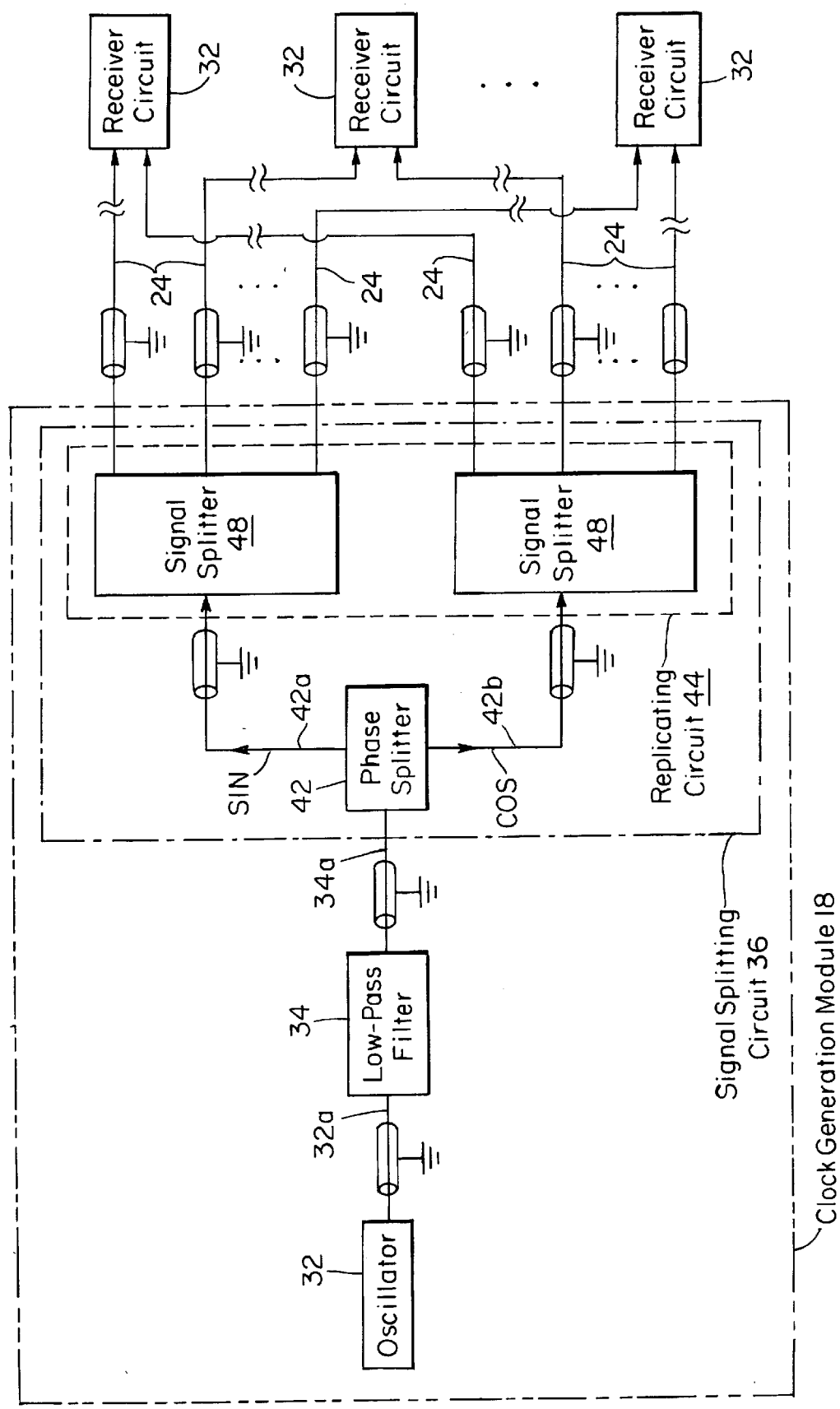
FIG. 2 is a detailed block diagram of the clock generation module and clock lines for distributing clock signals to the receiver circuits of FIG. 1.

FIG. 2 shows the clock module 18 in accordance with an illustrative embodiment of the invention. The clock module 18 has an oscillator 32 for generating a sinusoidal signal at the frequency of the above-mentioned clock signal, a preferably passive, low-pass filter 34 for removing harmonics of the sinusoidal signal, and a signal splitting circuit 36 for generating various sinusoidal clock signals of desired phases for distribution to the clock receiver circuits 26 (FIG. 1) by the clock lines 24.

More specifically, the oscillator 32 is a conventional, commercially available sinusoidal-wave generator, which has an output, e.g., of about 10 volts peak-to-peak in a 50 ohm system, at a pre-determined fundamental frequency, e.g., 58 MHz. The output of the oscillator 32 typically also includes harmonics of the fundamental frequency. The oscillator output is provided over a shielded transmission line 32a to the low-pass filter 34.

The low-pass filter 34 passes the fundamental frequency of the output from the oscillator 32 with minimal attenuation, and substantially attenuates or blocks harmonics of the fundamental frequency (e.g., a 60 dB reduction of the second harmonic, etc.). By largely eliminating the harmonics near the source, i.e., near the oscillator 32, the invention eliminates the propagation rate variations that might otherwise arise in the clock lines 24 as a result of those frequencies. Moreover, this also reduces the likelihood that those frequencies will give rise to electromagnetic emissions from the clock lines 24. The filter output is passed over a shielded transmission line 34a to the signal splitting circuit 36.

Depending on the application, the signal splitting circuit 36 can produce multiple versions of the clock signals having the same phases, differing phases or both. As illustrated in FIG. 1, the signal splitting circuit 36 has a phase splitter 42 responsive to the sinusoidal signal from the filter 34 for producing clock signals at phases that are 90° apart, i.e., quadrature-related clock signals. These signals can be denoted simply as sine ("sin") and cosine ("cos") clock signals. The phase splitting circuit output is passed over equal-length shielded transmission lines 42a, 42b to a replicating circuit 44.

The replicating circuit 44 of the signal splitting circuit 36 includes an "n"-way signal splitter 46 for making "n" copies of the sin clock signal received over line 42a, and a "m"-way signal splitters 48 for making "m" copies of the cos clock signal received over line 42b, where "n" and "m" are positive integers whose value depends on the application. (In the illustrated implementation of the invention, m=n=4.)

The phase splitter 42 and signal splitters 46, 48 are conventional, preferably passive devices that are commercially available. It is desirable to use devices for these components that do not exhibit any significant temperature dependencies over the intended operating conditions, that do not introduce any significant delays in the clock signals, and that provide a high degree of isolation between signal lines. While resistor divider circuits could be used, such circuits typically only provide about 6 dB of isolation. A preferred device for the phase splitter 42 is Model No. PSC-Q-2-70 power splitter/combiner, 2 way—90°, and for the signal splitters is Model No. PSC-10-1 power splitter/combiner, 10 way—0°, both of which can be obtained from Mini-Circuits, Brooklyn, N.Y. These preferred devices provide about 20 dB isolation under most conditions.

In other implementations of the invention, which are adapted for particular applications that do not require quadrature-related clock signals, the phase splitter 42 can be eliminated, and the filter output can be passed directly to a replicating circuit 44 including, e.g., a single signal splitter 46.

The clock lines 24 are preferably shielded signal paths, e.g., shielded coaxial cable, in a single-ended arrangement. Single-ended arrangements are advantageous in that they require fewer conductors than differential signal paths, and thus reduce the number of potential radiation sources or receivers. In addition, the fewer number of conductors of single-ended systems require less area on the circuit board. The clock lines 24 will be described later in more detail.

The replicating circuit 44 feeds the multiple copies of the clock signals to the transmission system 24 for distribution to users thereof within the computer system 10. More specifically, one of the sin clock signals and one of the cos clock signals are directed over a respective clock line 24 to a receiver circuit 32 of an associated module 12, 14a, 14b, 16.

Figure 3:
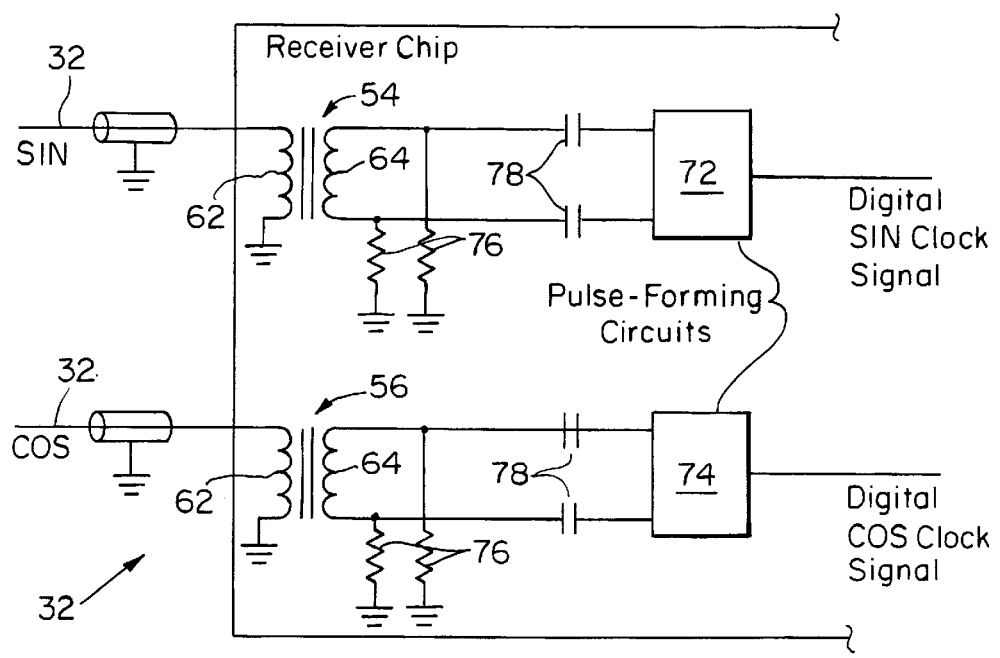
FIG. 3 is a schematic, partially in block diagram form, of one of the receiver circuits of FIG. 1.

FIG. 3 shows an illustrative implementation of one receiver circuit 32; the other receiver circuits 32 can be of identical construction, therefore requiring no further description herein.

The receiver circuit 32 has first and second transformers 54, 56 for converting the single-ended signal paths of the clock lines 32 into respective differential signal paths. Preferably, each transformer 54, 56 is a two-to-one, step-down transformer. The transformers 54, 56 have primary windings 62, 64 tied to ground, which receive the clock signals from the clock lines 32 and center-tapped secondary windings 66, 68 for providing differential clock signals to pulse-forming circuits 72, 74. Each of the differential lines from the secondary windings 62, 64 is terminated by, e.g., a 50 ohm resistor 76 connected to ground, and includes a DC blocking capacitor 78. The pulse-forming circuits 72, 74 preferably include differential amplifiers that are limited in their output swings for converting the received sinusoidal clock signals into digital clock signals having minimal skew. The receiver circuit 32 can also have other components as well, such as an amplifier, a filter and buffers, which are not shown.

Figure 4:
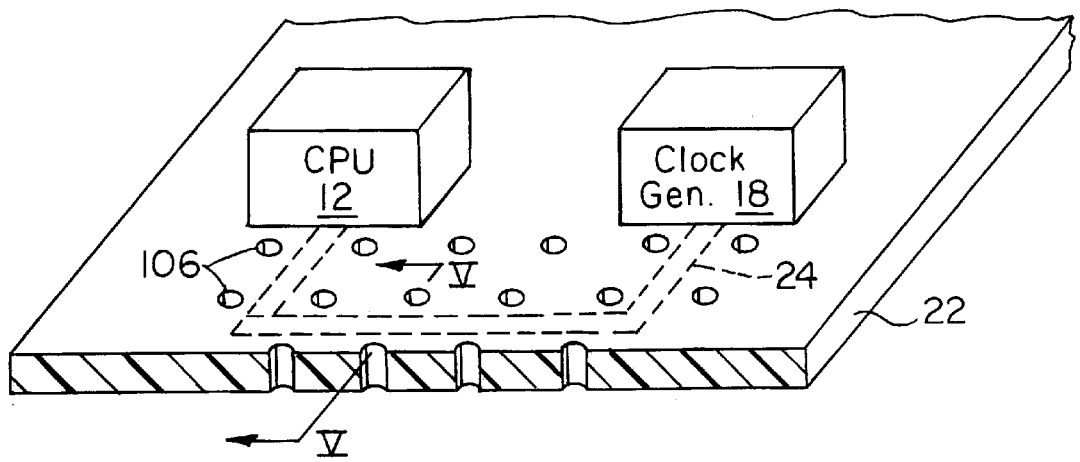
FIG. 4 is a perspective view of the printed circuit board of FIG. 1, which shows a preferred arrangement for isolating the clock lines.
Figure 5:
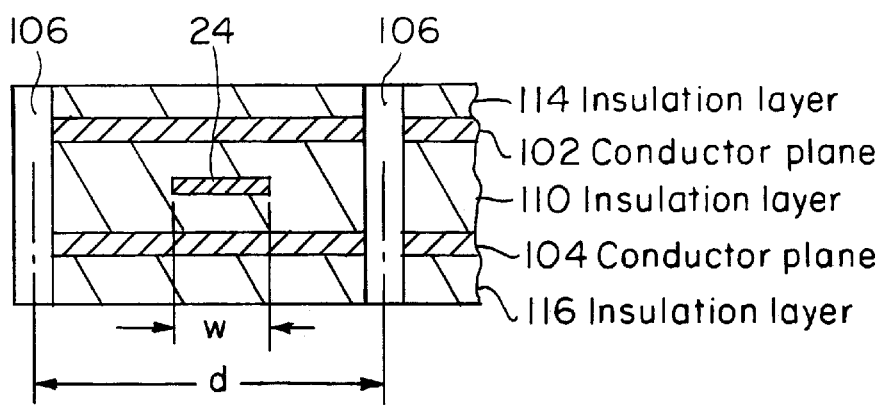
FIG. 5 is an enlarged, sectional view taken along line V—V of FIG. 4.

In accordance with another aspect of the invention that is illustrated in FIGS. 4 and 5, each clock line 24 is shielded against cross-talk and electromagnetic radiation by a novel strip-line arrangement. FIG. 4 shows a portion of the mother board 22, including the clock generation module 18 and another module, e.g., the CPU 12.

The clock line 24 is provided as an etched line, which interconnects the CPU 12 and clock generation module 18. Preferably, as described above, the illustrated clock line 24 has the same overall dimensions, including length, is made of the same material, and has substantially the same overall impendance, as the clock lines 24 interconnecting the clock generation module 18 to the other modules 14a, 14b, 16. If one of the modules 12–16 were physically closer than the others to the clock generation module 18, the clock line 24 for that closer module preferable would take a more circuitous path to its associated module, so to have the same length as the other clock lines.

As shown more clearly in FIG. 5, the clock line 24 is shielded against radiation by a virtual "cage" formed by top and bottom conductive planes 102, 104, and a plurality of spaced conductive vias 106 that can be pictured as the "bars" of the cage. More specifically, the clock line 24 is disposed within an inner insulating layer 110, which is sandwiched between the top and bottom conductive planes 102, 104, which are, in turn, sandwiched between top and bottom, outer insulating layers 114, 116. The mother board 22 can have other layers not shown in the drawing, which will be apparent to those skilled in the art.

It was recognized that by spacing the conductive vias 106 at a pre-determined distance "d," the strip-line arrangement would effectively block radiation below a certain wavelength from penetrating between the conductive vias 106. The distance "d" can be determined empirically. Generally, a useful rule of thumb is to space the clock lines at a distance equal to $\frac{1}{10}$ of the shortest wavelength of the radiation to be blocked.

It was found that, for the clock signal of 58 MHz, it would be desirable to block radiation at not only that frequency, but also at a number of harmonics above that frequency. Thus, the distance "d" was chosen to be about 0.2 to 0.3 inches (0.5 to 0.76 cm). Advantageously, this spacing puts the interfering potential from other signals above the cutoff frequency of the transformers 54, 56. Also, this spacing provides adequate shielding of the clock lines 24 against externally originating radiation that might interfere with the clock signal, and, as noted above, against the emission of radiation from the clock lines 24.

The foregoing description has been limited to a specific embodiment of this invention. It will be apparent, however, that variations and modifications may be made to the embodiment, with the attainment of some or all of the advantages of the invention. For example, the just-described arrangement for shielding signal paths can be used in a variety of applications, and is not limited to shielding of clock lines. Therefore, it is the object of the appended claims to cover all such variations and modifications as come within the true spirit and scope of the invention.

What is claimed:

1. In a digital computer having a plurality of modules having operations which are synchronized by a plurality of digital clock signals, each of said plurality of digital clock signals having a clock frequency, said modules being interconnected for communication therebetween by a synchronous bus and being disposed on a single printed circuit board, an apparatus for generating said plurality of digital clock signals with minimal clock skew, said apparatus comprising:

a sinusoidal wave oscillator that generates a sinusoidal signal comprising a predetermined fundamental component at said clock frequency which is a fundamental frequency, and another component at harmonics of said clock frequency;

a low-pass filter coupled with said oscillator for filtering the sinusoidal signal to substantially attenuate said harmonics, thereby producing a filtered sinusoidal signal from said sinusoidal signal;

signal splitting means coupled to said low-pass filter and connected to a plurality of single-ended clock lines for generating a plurality of copies of said filtered sinusoidal signal without introducing any significant delays in the copies;

means provided by and on said printed circuit board for distributing said plurality of copies of said filtered sinusoidal signal to said modules, said distribution means comprising a plurality of shielded clock lines of said synchronous bus, and shielding means disposed around said clock lines for shielding said clock lines against externally originating radiation and against emission of radiation from said clock lines at a predetermined range of wavelengths, said clock lines being disposed in said printed circuit board and having approximately the same lengths, material and approximately the same overall signal propagation characteristics; and converting means coupled to said distributing means and provided on each of said modules for receiving at least one of said plurality of copies of said filtered sinusoidal signal and for converting said received at least one copy of said filtered sinusoidal signal into one of said plurality of digital clock signals, whereby said apparatus provides said plurality of digital clock signals with said minimum clock skew and without requiring skew compensation at said modules, and providing equal overall propagation rates for said plurality of digital clock signals.

2. The apparatus in accordance with claim 1,
(A) wherein said signal splitting means comprises:
  i) phase splitting means for generating first and second, quadrature-related sinusoidal signals;
  ii) first signal splitting means receiving said first quadrature-related sinusoidal of said phase splitting means for generating a plurality of first output signals; and
  iii) second signal splitting means receiving said second quadrature-related sinusoidal signal of said phase splitting means for generating a plurality of second output signals; and
(B) wherein said converting means of said modules converts said first and second output signals into said digital clock signals.

3. The apparatus in accordance with claim 1, wherein said shielding means comprises:

first and second conductive layer disposed in spaced parallel relation to each of said shielded clock lines;

a plurality of conductive vias interconnecting said first and second conductive layers, said plurality of conductive vias being disposed adjacent to, and in a selected spaced relation to, said each of said shielded clock lines, said conductive vias being spaced from one another by a distance selected such that said conductive vias and said first and second conductive layers substantially prevent penetration there-through of said radiation; and an insulating material disposed between said first and second conductive layers and said each of said shielded clock lines and between said conductive vias and said each of said shielded clock lines.

4. The apparatus in accordance with claim 3, wherein said distance is less than about one tenth of the shortest wavelength of said predetermined range of wavelengths.

5. The apparatus in accordance with claim 3, wherein said distance is about 0.2 to 0.3 inches (0.5 to 0.76 cm).

6. In a digital computer having a plurality of modules having operations which are synchronized by a plurality of digital clock signals, said digital clock signals having a clock frequency, said modules being interconnected for communication therebetween by a synchronous bus and being disposed on a single printed circuit board, a method for generating said digital clock signals with minimal clock skew comprising the steps of:

generating a sinusoidal clock signal including using a sinusoidal-wave oscillator for generating a sinusoidal signal comprising a fundamental component at a preselected clock frequency and another component at harmonics thereof;

filtering the sinusoidal signal to substantially attenuate said harmonics, thereby producing a filtered sinusoidal signal;

generating a plurality of copies of said filtered sinusoidal signal;

distributing said plurality of said copies of said filtered sinusoidal signal to said modules along a plurality of single ended clock lines of said synchronous bus disposed in the printed circuit board, said clock lines having approximately the same overall length, material and approximately the same overall signal propagation characteristics;

shielding said clock lines against externally originating radiation and against the emission of radiation from said clock lines at a predetermined range of wavelengths by a shield provided by said printed circuit board and disposed around said clock lines; and receiving into each said plurality of modules at least one of said plurality of said copies of said filtered sinusoidal signal and converting said at least one received sinusoidal clock signal into one of said digital clock signals, whereby said method provides said digital clock signals with minimum clock skew and without requiring skew compensation at said modules.

7. The method in accordance with claim 6,
(A) wherein said copy-generating step includes the steps of:
  i) generating first and second, quadrature-related sinusoidal signals from said filtered sinusoidal signal;
  ii) generating a plurality of first output signals from said quadrature-related sinusoidal signals;

iii) generating a plurality of second output signals from said quadrature-related sinusoidal signals; and (B) wherein said receiving and converting step performed by said modules includes the steps of receiving one of said first output signals and one of said output clock signals and converting into said digital clock signals.

8. The method in accordance with claim 7, wherein said shielding step comprises:

disposing first and second conductive layers in spaced parallel relation to each of said clock lines;

providing a plurality of conductive vias for interconnecting said first and second conductive layers said conductive vias being adjacent to, and in spaced relation to, said each of said clock lines;

spacing said conductive vias from one another by a distance selected such that said conductive vias and said first and second conductive layers substantially prevent penetration there-through of said radiation; and disposing an insulating material between said first and second conductive layers and said each of said clock lines and between said conductive vias and said each of said clock lines.

9. The method in accordance with claim 7, wherein said spacing step spaces said conductive vias at less than about one tenth of the shortest wavelength of said predetermined range of wavelengths.

10. The method in accordance with claim 8, wherein said spacing step spaces said conductive vias at about 0.2 to 0.3 inches (0.5 to 0.76 cm).

* * * * *